(12) United States Patent
Park

(10) Patent No.: US 11,683,954 B2
(45) Date of Patent: Jun. 20, 2023

(54) FLEXIBLE DISPLAY APPARATUS

(71) Applicant: SAMSUNG DISPLAY CO., LTD., Yongin-si (KR)

(72) Inventor: Hyekyung Park, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/341,164

(22) Filed: Jun. 7, 2021

(65) Prior Publication Data

US 2021/0296614 A1    Sep. 23, 2021

Related U.S. Application Data

(60) Continuation of application No. 16/853,907, filed on Apr. 21, 2020, now Pat. No. 11,063,241, which is a continuation of application No. 16/290,558, filed on Mar. 1, 2019, now Pat. No. 10,629,846, which is a division of application No. 15/423,128, filed on Feb. 2, 2017, now Pat. No. 10,224,504.

(30) Foreign Application Priority Data

Feb. 2, 2016    (KR) .................. 10-2016-0012917

(51) Int. Cl.
| | |
|---|---|
| H01L 51/52 | (2006.01) |
| H10K 50/844 | (2023.01) |
| H10K 59/124 | (2023.01) |
| H10K 59/121 | (2023.01) |
| H10K 77/10 | (2023.01) |
| H10K 59/122 | (2023.01) |
| H10K 102/00 | (2023.01) |

(52) U.S. Cl.
CPC ......... *H10K 50/844* (2023.02); *H10K 59/124* (2023.02); *H10K 59/1213* (2023.02); *H10K 77/111* (2023.02); *H10K 59/122* (2023.02); *H10K 2102/311* (2023.02); *Y02E 10/549* (2013.01)

(58) Field of Classification Search
CPC ............ H01L 51/5253; H01L 27/3258; H01L 27/3262
See application file for complete search history.

(56) References Cited

U.S. PATENT DOCUMENTS

| | | | |
|---|---|---|---|
| 6,373,453 | B1 | 4/2002 | Yudasaka |
| 8,345,204 | B2 | 1/2013 | Lee et al. |
| 9,082,667 | B2 | 7/2015 | Youn et al. |
| 9,123,911 | B2 | 9/2015 | Kim et al. |
| 9,229,566 | B2 | 1/2016 | Kang |

(Continued)

FOREIGN PATENT DOCUMENTS

| | | |
|---|---|---|
| KR | 10-2010-0048265 | 5/2010 |
| KR | 10-2014-0080231 | 6/2014 |

(Continued)

*Primary Examiner* — Thao P Le
(74) *Attorney, Agent, or Firm* — F. Chau & Associates, LLC

(57) ABSTRACT

A display apparatus includes a flexible substrate and a first insulation layer disposed on the flexible substrate. The flexible substrate includes a bending area. The first insulation layer includes a first unevenness disposed over the bending area. The first unevenness includes two or more steps in at least a portion of the first unevenness.

22 Claims, 5 Drawing Sheets

(56) References Cited

U.S. PATENT DOCUMENTS

| | | | |
|---|---|---|---|
| 10,244,504 B2 | 3/2019 | Park | |
| 10,629,846 B2 | 4/2020 | Park | |
| 11,458,716 B2* | 10/2022 | Ishii | B32B 38/1866 |
| 2008/0157235 A1 | 7/2008 | Rogers et al. | |
| 2009/0045409 A1 | 2/2009 | Yamazaki | |
| 2014/0232956 A1 | 8/2014 | Kwon et al. | |
| 2014/0254111 A1 | 9/2014 | Yamazaki et al. | |
| 2014/0306985 A1* | 10/2014 | Jeong | G09G 3/035 345/600 |
| 2015/0028328 A1 | 1/2015 | Ikeda et al. | |
| 2015/0048349 A1 | 2/2015 | Kawata et al. | |
| 2016/0019019 A1 | 1/2016 | Ikeda et al. | |
| 2016/0079333 A1 | 3/2016 | Shishido | |
| 2016/0147109 A1 | 5/2016 | Yamazaki et al. | |
| 2016/0259365 A1* | 9/2016 | Wang | H05K 5/0217 |
| 2017/0066221 A1* | 3/2017 | Lee | B32B 5/142 |
| 2017/0207246 A1 | 7/2017 | Wu et al. | |
| 2017/0222184 A1 | 8/2017 | Park | |
| 2017/0256599 A1 | 9/2017 | Kim et al. | |
| 2017/0262109 A1 | 9/2017 | Choi et al. | |
| 2018/0012944 A1 | 1/2018 | Gunji | |
| 2018/0068613 A1 | 3/2018 | Chung et al. | |
| 2018/0108717 A1 | 4/2018 | Seol et al. | |
| 2018/0342536 A1 | 11/2018 | Suzumura | |
| 2019/0198808 A1 | 6/2019 | Park | |
| 2020/0013970 A1 | 1/2020 | Wang et al. | |
| 2020/0251686 A1 | 8/2020 | Park | |
| 2020/0379515 A1* | 12/2020 | Cho | G06F 1/1679 |
| 2022/0028956 A1* | 1/2022 | You | H01L 27/3276 |
| 2022/0088911 A1* | 3/2022 | Kim | B32B 37/12 |
| 2022/0149324 A1* | 5/2022 | Park | H01L 51/0097 |

FOREIGN PATENT DOCUMENTS

| | | |
|---|---|---|
| KR | 10-2014-0103025 | 8/2014 |
| KR | 10-2014-0118222 | 10/2014 |
| KR | 10-2014-0127633 | 11/2014 |
| KR | 10-2014-0140150 | 12/2014 |
| KR | 10-2015-0027956 | 3/2015 |

* cited by examiner

FLEXIBLE DISPLAY APPARATUS

CROSS-REFERENCE TO RELATED APPLICATION

This application is a Continuation of Co-Pending U.S. patent application Ser. No. 16/853,907, filed on Apr. 21, 2020, which is a Continuation of U.S. patent application Ser. No. 16/290,558, filed on Mar. 1, 2019 (now U.S. Pat. No. 10,629,846, issued on Apr. 21, 2020), which is a Division of U.S. patent application Ser. No. 15/423,128, filed on Feb. 2, 2017 (now U.S. Pat. No. 10,224,504, issued on Mar. 5, 2019), which claims priority under 35 U.S.C. § 119 to Korean Patent Application No. 10-2016-0012917, filed on Feb. 2, 2016 in the Korean Intellectual Property Office, the disclosures of which are incorporated by reference herein in their entirety.

TECHNICAL FIELD

One or more exemplary embodiments of the present invention relate to a display apparatus, and more particularly to a flexible display apparatus.

DISCUSSION OF RELATED ART

Organic light-emitting display apparatuses may have relatively wide viewing angles, relatively high contrast ratios, and relatively short response times.

Organic light-emitting display apparatuses may include thin film transistors and organic light-emitting devices are formed on a substrate. The organic light-emitting devices may emit light during operation of the organic light-emitting display apparatus. The organic light-emitting display apparatus may be used as a display unit of a small product, such as a cellular phone. Alternatively, the organic light-emitting display apparatus may be used as a display unit of a large product, such as a television.

Organic light-emitting display apparatuses may be a flexible display apparatus. The flexible display apparatus may include a flexible substrate. The flexible substrate may include a glass substrate or a synthetic resin. Since the flexible substrate can be relatively easily bent, it may be difficult to handle the flexible substrate in a manufacturing process. Accordingly, cracks may occur in the being area of the flexible display apparatus in the flexible substrate, which may reduce a reliability of the flexible display apparatus.

SUMMARY

According to one or more exemplary embodiments of the present invention, a display apparatus includes a flexible substrate and a first insulation layer. The flexible substrate includes a bending area. The first insulation layer is disposed on the flexible substrate. The first insulation layer includes a first unevenness disposed over the bending area. The first unevenness includes two or more steps in at least a portion of the first unevenness.

The first unevenness may be a depression comprising at least two steps at different distances from the flexible substrate.

The first unevenness may have a stepped shape. The stepped shape may be sunk toward a center of the first unevenness.

The first unevenness may have a V shape.

The first insulation layer may be an inorganic insulation layer.

A width of the first insulation layer may be less than about 1 mm.

The display apparatus may further include a plurality of pixels. The plurality of pixels may be arranged over the bending area of the flexible substrate. The first unevenness may be disposed between adjacent pixels.

The flexible substrate may have a bending axis extending in one direction. The first unevenness may extend in a direction substantially parallel to the bending axis.

The display apparatus may further include a second insulation layer. The second insulation layer may be arranged over the first insulation layer. The second insulation layer may include a second unevenness. The second unevenness may include two or more steps in at least a portion of the second unevenness.

The second unevenness may be arranged over the first unevenness.

The second insulation layer may be an inorganic insulation layer.

A thickness of a portion of the first unevenness of the first insulation layer may be smaller than a thickness of a portion of the first insulation layer excluding the first unevenness.

The flexible substrate may include a first surface and a second surface opposite to the first surface. The flexible substrate may be bent such that the second surface at least partially faces itself. The first insulation layer may be arranged over the first surface of the flexible substrate.

According to one or more exemplary embodiments of the present invention, a display apparatus includes a substrate, a semiconductor layer, a first insulation layer, a gate electrode, a second insulation layer, a source electrode, and a drain electrode. The semiconductor layer is disposed on the substrate. The first insulation layer is disposed on the semiconductor layer. The gate electrode is disposed on the first insulation layer. The second insulation layer is disposed on the gate electrode. The source electrode and the drain electrode are disposed on the second insulation layer. The first insulation layer includes a first unevenness. The first unevenness is located in at least one region of the first insulating layer. The second insulating layer includes a second unevenness. The second unevenness is located in a region corresponding to the first unevenness.

The display apparatus may further include a third insulation layer and a pixel electrode. The third insulation layer may be disposed on the second insulation layer. The pixel electrode may be disposed on the third insulation layer.

The third insulation layer may include a third unevenness. The third unevenness may be located in a region corresponding to the first unevenness.

The display apparatus may further include a fourth insulation layer, and intermediate layer, and an opposite electrode. The fourth insulation layer may include an opening. The opening may expose at least a portion of the pixel electrode. The intermediate layer may be disposed on the pixel electrode. The opposite electrode may cover the intermediate layer. The opposite electrode may face the pixel electrode.

The fourth insulation layer may include a fourth unevenness. The fourth unevenness may be located in a region corresponding to the first unevenness.

The substrate may have a bending axis. The bending axis may extend in one direction. The first unevenness may extend in a direction substantially parallel to the bending axis.

BRIEF DESCRIPTION OF THE DRAWINGS

These and/or other aspects will become apparent and more readily appreciated from the following description of the exemplary embodiments, taken in conjunction with the accompanying drawings, in which.

DETAILED DESCRIPTION OF THE EMBODIMENTS

Figure 1:
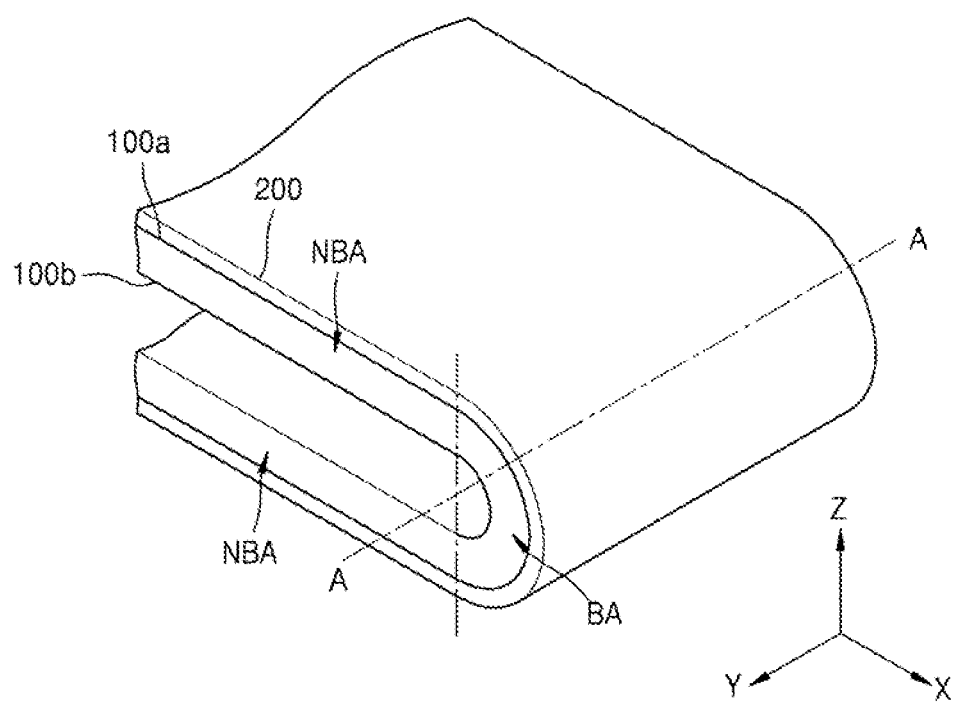
FIG. 1 is a schematic lateral view illustrating a flexible display apparatus according to an exemplary embodiment of the present invention.

As the present invention allows for various changes and numerous embodiments, exemplary embodiments of the present invention will be illustrated in the drawings and described in detail herein. Hereinafter, aspects and features of one or more exemplary embodiments of the present invention and methods of accomplishing the same will be described more fully with reference to the accompanying drawings; however the present invention may be embodied in many different forms and should not be construed as being limited to the embodiments set forth herein. Those components that are the same or are similar to components in other figures may be referred to by the same reference numeral in all of the figures and redundant explanations may be omitted.

It will be further understood that when a layer, region, or component is referred to as being "formed on" or "disposed on" another layer, region, or component, it can be directly or indirectly formed or disposed on the other layer, region, or component. Therefore, intervening layers, regions, or components may be present.

Sizes of components in the drawings may be exaggerated for convenience of explanation and the following exemplary embodiments of the present invention are not limited thereto.

The x-axis, the y-axis and the z-axis are not limited to three axes of the rectangular coordinate system. For example, the x-axis, the y-axis, and the z-axis may be substantially perpendicular to one another or may represent different directions that are not substantially perpendicular to one another.

Figure 2:
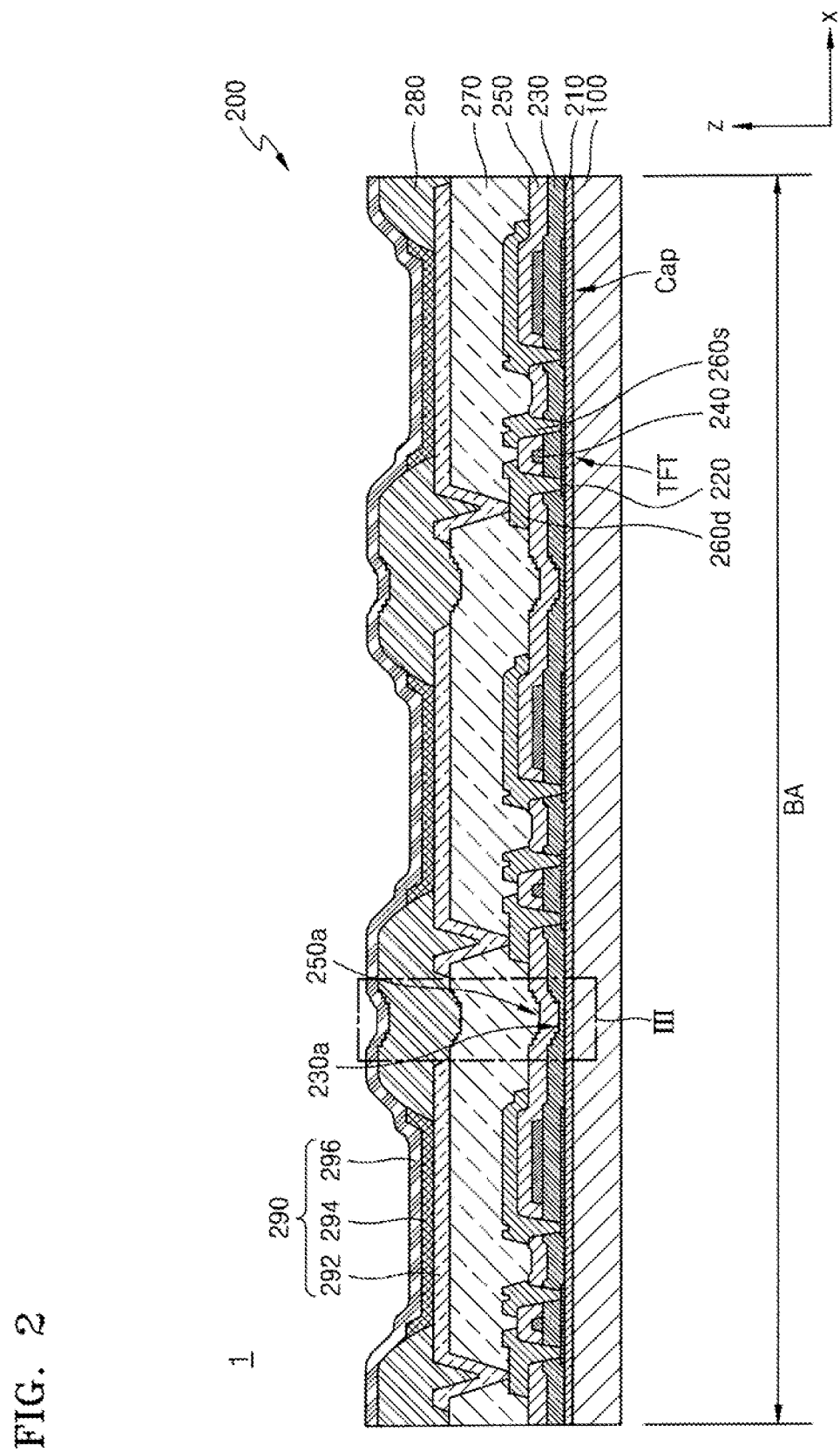
FIG. 2 is a schematic cross-sectional view illustrating a bending area of a flexible display apparatus of FIG. 1 according to an exemplary embodiment of the present invention.
Figure 3:
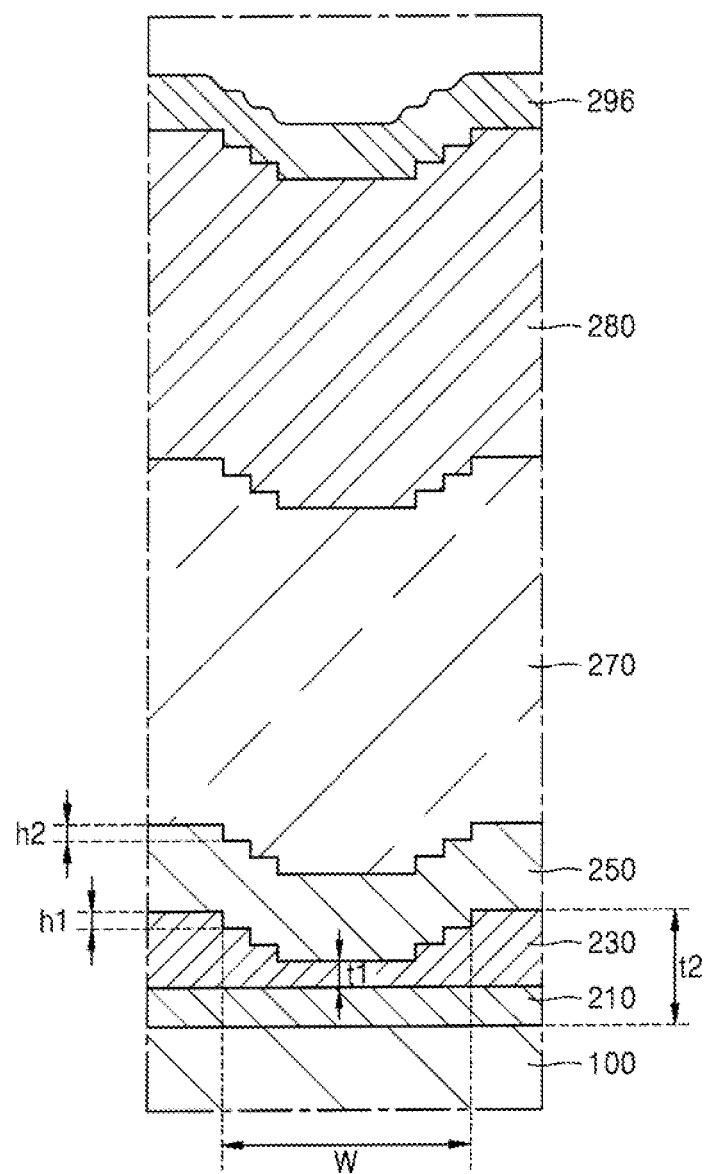
FIG. 3 is an enlarged cross-sectional view illustrating a portion III of FIG. 2 according to an exemplary embodiment of the present invention.

FIG. 1 is a schematic lateral view illustrating a flexible display apparatus according to an exemplary embodiment of the present invention. FIG. 2 is a schematic cross-sectional view illustrating a bending area BA of a flexible display apparatus of FIG. 1 according to an exemplary embodiment of the present invention. FIG. 3 is an enlarged cross-sectional view illustrating a portion III of FIG. 2 according to an exemplary embodiment of the present invention.

Referring to FIGS. 1 and 2, a flexible display apparatus 1 may include a flexible substrate 100. The flexible display apparatus 1 may also include a display unit 200. The display unit 200 may be arranged over the flexible substrate 100. The display unit 200 may have a first unevenness 230a and a second unevenness 250a. The first unevenness 230a and the second unevenness 250a may be a depression. The depression may include at least two steps at different distances from the flexible substrate 100.

The flexible substrate 100 may be flexible. The flexible substrate 100 may include a metal material or a plastic material. The metal material and the plastic material may have a relatively high heat resistance and a relatively high durability. The plastic material may include various materials. For example, the plastic material may include polyethylene terephthalate (PET), polyethylene naphthalate (PEN), polyimide (PI), polyethersulfone (PES), polyacrylate (PA), polyetherimide (PEI), polyphenylene sulfide (PPS), polyarylate (PAR), polycarbonate (PC), cellulose triacetate, cellulose acetate propionate (CAP), or poly(arylene ether sulfone); however, exemplary embodiments of the present invention are not limited thereto.

The flexible substrate 100 may include a bending area BA. Referring to FIG. 1, the flexible substrate 100 may include non-bending areas NBA. The non-bending areas NBA may be disposed at sides of the bending area BA. The non-bending areas NBA may be folded to face each other with respect to the bending area BA; however, exemplary embodiments of the present invention are not limited thereto. The flexible substrate 100 may only include the bending area BA. When the flexible substrate 100 includes the bending area BA and the non-bending areas NBA, the bending area BA may be disposed at an edge portion of the flexible substrate 100. Widths of the non-bending areas NBA disposed at sides of the bending area BA may be different from each other.

Meanwhile, the flexible display apparatus according to the present embodiment may have a bendable characteristic. That is, the flexible display apparatus may be formed to have a bendable characteristic so that the display device can bend as needed, instead of being always bended. In this case, when the display device is bent, the bent portion may be defined as a bending area BA, and the other regions may be defined as a non-bending area NBA.

The flexible substrate 100 may include a first surface 100a. The flexible substrate 100 may also include a second surface 100b. The second surface 100b may be opposite to the first surface 100a. As illustrated in FIG. 1, at least a portion of the second surface 100b of the flexible substrate 100 may be bent in order to face itself. The first surface 100a of the flexible substrate 100 may face the outside in a bending state. The display unit 200 may be arranged over the first surface 100a of the flexible substrate 100.

The display unit 200 may be arranged over the flexible substrate 100. The display unit 200 may include a plurality of pixels. For example, the display unit 200 may be an organic light-emitting display unit or a liquid crystal display unit. The organic light-emitting display unit and the liquid crystal display unit may include a plurality of thin film transistors TFT and a plurality of pixel electrodes 292. The pixel electrodes 292 may be electrically connected to the thin film transistors TFT. The display unit 200 may also include a capacitor Cap.

FIG. 2 is a schematic cross-sectional view illustrating the bending area BA of the flexible display apparatus 1 of FIG. 1 according to an exemplary embodiment of the present invention.

As illustrated in FIG. 2, the display unit 200 positioned in the bending area BA may include the first unevenness 230a and the second unevenness 250a.

The display unit 200 may include a buffer layer 210. The buffer layer 210 may be arranged over the flexible substrate 100. The buffer layer 210 may include silicon oxide or silicon nitride. The buffer layer 210 may planarize a surface of the flexible substrate 100. The buffer layer 210 may also reduce or prevent impurities from infiltrating into a semiconductor layer 220 of the thin film transistor TFT. The semiconductor layer 220 may be disposed on the buffer layer 210.

A gate electrode 240 may be arranged above the semiconductor layer 220. A source electrode 260s and a drain electrode 260d may be electrically connected to each other when a voltage is applied to the gate electrode 240. The gate electrode 240 may include a single layer. Alternatively, the gate electrode 240 may include multiple layers. The gate electrode 240 may include one or more materials including aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), or copper (Cu); however, exemplary embodiments of the present invention are not limited thereto. The one or more materials may be selected according to adhesiveness to an adjacent layer, surface smoothness of a stacked layer, or processability.

A first insulation layer 230 may be disposed between the semiconductor layer 220 and the gate electrode 240. The first insulation layer 240 may provide insulation between the semiconductor layer 220 and the gate electrode 240. The first insulation layer 230 may be an inorganic insulation layer. The first insulation layer 230 may include silicon oxide and/or silicon nitride.

A second insulation layer 250 may be arranged above the gate electrode 240. The second insulation layer 250 may be an inorganic insulation layer. The second insulation layer 250 may include a single layer. Alternatively, the second insulation layer 250 may include multiple layers. The second insulation layer 250 may include silicon oxide or silicon nitride. The second insulation layer 250 may be an interlayer insulation layer.

The source electrode 260s and the drain electrode 260d may be arranged above the second insulation layer 250. Each of the source electrode 260s and the drain electrode 260d may be electrically connected to the semiconductor layer 220. The source electrode 260s and the drain electrode 260d may be electrically connected to the semiconductor layer 220 via contact holes. The contact holes may be formed in the second insulation layer 250 and the first insulation layer 230. The source electrode 260s and the drain electrode 260d may each include a single layer. Alternatively, the source electrode 260s and the drain electrode 260d may each include multiple layers. The source electrode 260s and the drain electrode 260d may each include one or more materials including aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), or copper (Cu); however, exemplary embodiments of the present invention are not limited thereto. The one or more materials may be selected according to conductivity.

A protective layer may cover the thin film transistor TFT. The protective layer may be configured to protect the thin film transistor TFT. The protective layer may include an inorganic material. For example, the protective layer may include silicon oxide, silicon nitride, or silicon oxynitride.

A third insulation layer 270 may be arranged over the flexible substrate 100. The third insulation layer 270 may be a planarization layer or a protective layer. When an organic light-emitting device 290 is arranged above the thin film transistor TFT, the third insulation layer 270 may planarize an upper surface of the thin film transistor TFT. The third insulation layer 270 may also protect the thin film transistor TFT and various devices. The third insulation layer 270 may include, for example, an acrylic organic material or benzocyclobutene (BCB); however, exemplary embodiments of the present invention are not limited thereto.

As illustrated in FIG. 2, the buffer layer 210, the first insulation layer 230, the second insulation layer 250, and the third insulation layer 270 may be formed on the entire surface of the flexible substrate 100.

A fourth insulation layer 280 may be arranged above the thin film transistor TFT. The fourth insulation layer 280 may be a pixel-defining layer. The fourth insulation layer 280 may be arranged over the third insulation layer 270. The fourth insulation layer 280 may include an opening. The opening may define a pixel area. The fourth insulation layer 280 may expose a portion of the pixel electrode 292. The fourth insulation layer 280 may also cover portions of the pixel electrode 292. For example, the fourth insulation layer 280 may expose a center portion of the pixel electrode 292. The fourth insulation layer 280 may cover edge portions of the pixel electrode 292.

The fourth insulation layer 280 may include, for example, an organic insulation layer. The organic insulation layer may include an acrylic polymer such as poly(methyl methacrylate) (PMMA), polystyrene (PS), a polymer derivative containing a phenol group, an imide-based polymer, an aryl ether-based polymer, an amide-based polymer, a fluorine-based polymer, a p-xylene-based polymer, a vinyl alcohol-based polymer, or any combination thereof.

The organic light-emitting device 290 may be arranged over the fourth insulation layer 280. The organic light-emitting device 290 may include a pixel electrode 292, an intermediate layer 294, and an opposite electrode 296. The intermediate layer 294 may include an emission layer (EML).

The pixel electrode 292 may be a semi-transparent electrode, a transparent electrode, or a reflective electrode. When the pixel electrode 292 is a semi-transparent electrode or a transparent electrode, the pixel electrode 292 may include, for example, indium tin oxide (ITO), indium zinc oxide (IZO), zinc oxide (ZnO), indium oxide ($In_2O_3$), indium gallium oxide (IGO), or aluminum zinc oxide (AZO). When the pixel electrode 292 is a reflective electrode, the pixel electrode 292 may include a reflective layer. The reflective layer may include Ag, Mg, Al, Pt, Pd, Au, Ni, Nd, Ir, Cr, or a compound thereof. The pixel electrode 292 may also include a layer. The layer may include ITO, IZO, ZnO, $In_2O_3$, IGO, or AZO. However, exemplary embodiments of the present invention are not limited thereto. The pixel electrode 292 may include various materials. A structure of the pixel electrode 292 may be variously modified. For example, the pixel electrode 292 may include a single layer. Alternatively, the pixel electrode 292 may include multiple layers.

The intermediate layer 294 may be arranged in each pixel area defined by the fourth insulation layer 280. The intermediate layer 294 may include the EML. The EML may emit light according to an electrical signal. In addition to the EML, the intermediate layer 294 may further include a hole injection layer (HIL), a hole transport layer (HTL), an electron transport layer, (ETL) and an electron injection layer (EIL). The HTL may be disposed between the EML and the pixel electrode 292. The EIL may be disposed between the EML and the opposite electrode 296. The layers may be stacked in a single or complex structure. However, the intermediate layer 294 is not limited thereto and may have various structures.

The opposite electrode 296 covering the intermediate layer 294 including the EML and facing the pixel electrode 292 may be arranged over the entire surface of the flexible substrate 100. The opposite electrode 296 may be a semi-transparent electrode, a transparent electrode, or a reflective electrode.

When the opposite electrode 296 is a semi-transparent electrode or a transparent electrode, the opposite electrode 296 may include a layer. The layer may include metal. The metal may have a relatively low work function. For example, the metal may include Li, Ca, lithium fluoride/calcium (LiF/Ca), lithium fluoride/aluminum (LiF/Al), Al, Ag, Mg, or any combination thereof. The opposite electrode 296 may also include a semi-transparent conductive layer or a transparent conductive layer. The semi-transparent conductive layer and the transparent conductive layer may include ITO, IZO, ZnO, or $In_2O_3$; however, exemplary embodiments of the present invention are not limited thereto. When the opposite electrode 296 is a reflective electrode, the opposite electrode 296 may include a layer. The layer may include Li, Ca, LiF/Ca, LiF/Al, Al, Ag, Mg, or any combination thereof. However, a structure and a material of the opposite electrode 296 are not limited thereto.

Referring to FIGS. 2 and 3, the first insulation layer 230 corresponding to a gate insulation layer may be disposed on the entire surface of the flexible substrate 100. At least a portion of the first insulation layer 230 arranged over the bending area BA of the flexible substrate 100 may have the first unevenness 230a. The first unevenness 230a may have a stepped shape. The stepped shape may include at least two or more steps. Each step may have a height h1. As illustrated in FIGS. 2 and 3, the first unevenness 230a may have a "V" shape. The first unevenness 230a may have a stepped shape, which may be sunk toward the center.

A thickness t1 of a portion of the first unevenness 230a included in the first insulation layer 230 may be relatively smaller than a thickness t2 of a portion of the first insulation layer 230 excluding the first unevenness 230a. Thus, the thickness t1 of a portion of the first insulation layer 230 in which the first unevenness 230a is formed may be relatively smaller than the thickness t2 of a portion of the first insulation layer 230 in which the first unevenness 230a is omitted.

The first unevenness 230a may include three steps. Each step may have the height h1 as illustrated in FIG. 3. However, exemplary embodiments of the present invention are not limited thereto. The first unevenness 230a may include at least one step. The at least one step may have the height h. The first unevenness 230a may be modified according to a thickness of the first insulation layer 230 and the height h1.

The first unevenness 230a may have a width W. For example, the width W of the first unevenness 230a may be less than about 1 mm. As illustrated in FIG. 2, the first unevenness 230a may be arranged between pixels. Thus the width W of the first unevenness 230a may be relatively smaller than spaces between adjacent pixels.

The second insulation layer 250 corresponding to an interlayer insulation layer may be arranged over the first insulation layer 230. The second insulation layer 250 may have the second unevenness 250a. The second unevenness 250a may be disposed on the first unevenness 230a. Similar to the first unevenness 230a, the second unevenness 250a may be disposed over the bending area BA of the flexible substrate 100.

The second unevenness 250a may include at least two or more steps. Each step may have a height h2. Similar to the first unevenness 230a, the second unevenness 250a may have a "V" shape. The second unevenness 250a may have a stepped shape, which may be sunk toward the center.

The second unevenness 250a may include three steps. Each step may have the height h2. However, exemplary embodiments of the present invention are not limited thereto. The second unevenness 250a may include at least one step. The at least one step may have the height h2. The second unevenness 250a may be modified according to a thickness of the second insulation layer 250 and the height h2. The first unevenness 230a and the second unevenness 250a may each be formed by using various methods known in the art and are not limited to a specific method. For example, the first unevenness 230a and the second unevenness 250a may be formed by etching using a photo resist, patterning using a halftone mask, or ultrafine printing using screen printing or inkjet printing.

The third insulation layer 270 and the fourth insulation layer 280 arranged over the second insulation layer 250 may also be formed in a shape similar to upper surfaces of the first unevenness 230a of the first insulation layer 230 and the second unevenness 250a of the second insulation layer 250. Accordingly, the opposite electrode 296 disposed on the entire surface of an upper surface of the fourth insulation layer 280 may also be formed in a shape similar to the upper surface of the fourth insulation layer 280. The formation of the third insulation layer 270 and the fourth insulation layer 280 similar to shapes of upper surfaces of the first insulation layer 230 and second insulation layer 250 may provide unevennesses of the third insulation layer 270 and the fourth insulation layer 280 through a separate patterning process. When the third insulation layer 270 and the fourth insulation layer 280 are formed on the entire surface of the flexible substrate 100, the third insulation layer 270 and the fourth insulation layer 280 may have curves along a shape of an upper surface of the second unevenness 250a positioned on lower surfaces of the third insulation layer 270 and the fourth insulation layer 280.

Referring to FIG. 2, the display unit 200 arranged over the flexible substrate 100 may include the plurality of pixels. The first unevenness 230a may be arranged between the plurality of pixels. The plurality of pixels may be sub-pixels. The plurality of pixels may be pixels formed by collecting sub-pixels.

Referring to FIG. 1, the flexible substrate 100 may have a bending axis A-A. The bending axis A-A may extend in one direction in the bending area BA. Thus, the first unevenness 230a and the second unevenness 250a may extend in a direction substantially parallel to the bending axis A-A. The first unevenness 230a and the second unevenness 250a may extend substantially parallel to the bending axis A-A. Thus, surface areas of the first insulation layer 230 and the second insulation layer 250 of the flexible display apparatus 1 may relatively increase in the bending area BA. Accordingly, cracks or separation of the first insulation layer 230 and the second insulation layer 250 may be reduced or prevented.

The first insulation layer 230 and the second insulation layer 250 may each be inorganic insulation layers. Portions of the inorganic insulation layers positioned over the bending area BA may include the first unevenness 230a and the second unevenness 250a. Since the first insulation layer 230 and the second insulation layer 250 may each be inorganic insulation layers, stress may concentrate and cracks may occur in the bending area BA.

The flexible display apparatus 1 may include the first unevenness 230a and the second unevenness 250a disposed in the first insulation layer 230 and the second insulation layer 250, respectively. The first insulation layer 230 and the second insulation layer 250 may each be inorganic insulation layers. The first insulation layer 230 and the second insulation layer 250 may be arranged over the bending area BA. When the flexible display apparatus 1 is bent in the bending area BA, the first unevenness 230a and the second unevenness 250a may increase the surface areas of the first insulation layer 230 and the second insulation layer 250. Thus, a stress applied to the first insulation layer 230 and the second insulation layer 250 may be reduced. Therefore, cracks or separation of the first insulation layer 230 and the second insulation layer 250 may be prevented.

Figure 4:
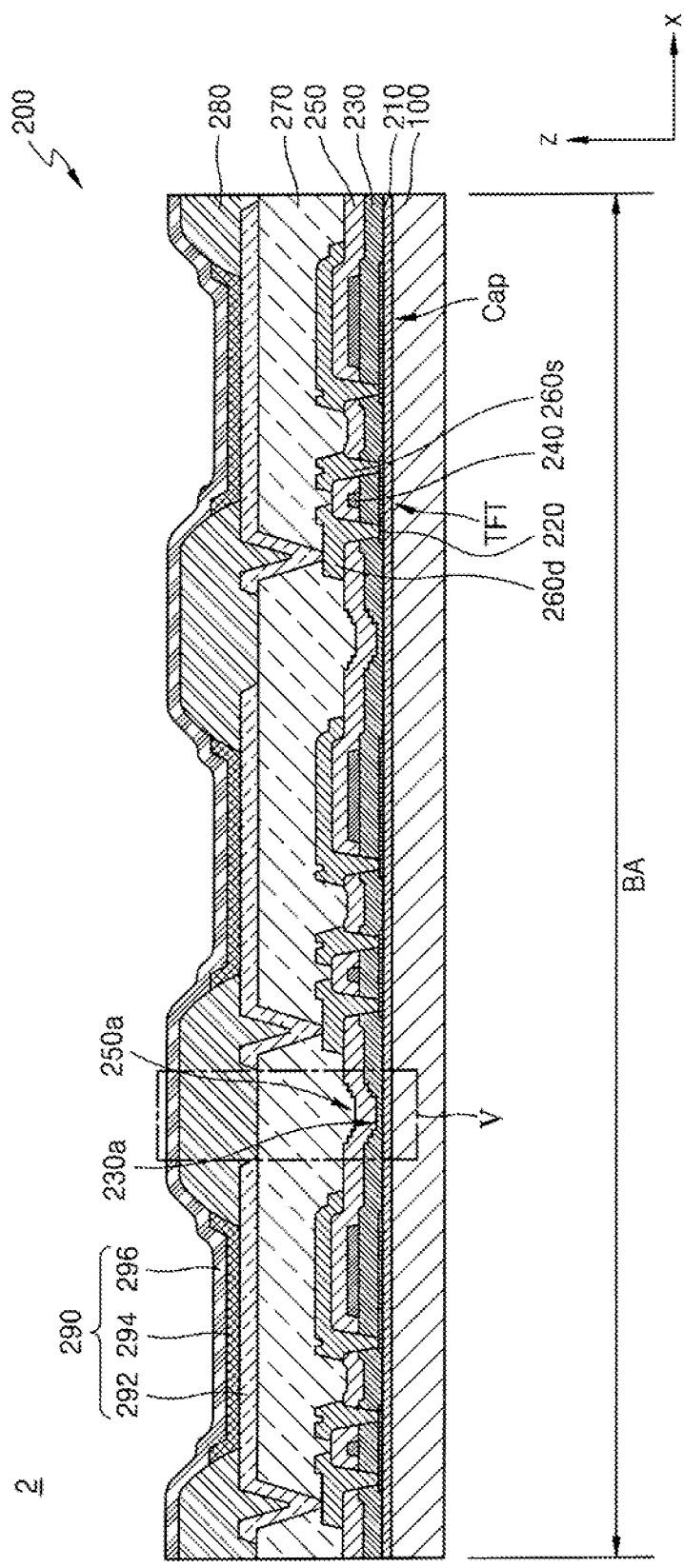
FIG. 4 is a schematic cross-sectional view illustrating a bending area of a flexible display apparatus according to an exemplary embodiment of the present invention.
Figure 5:
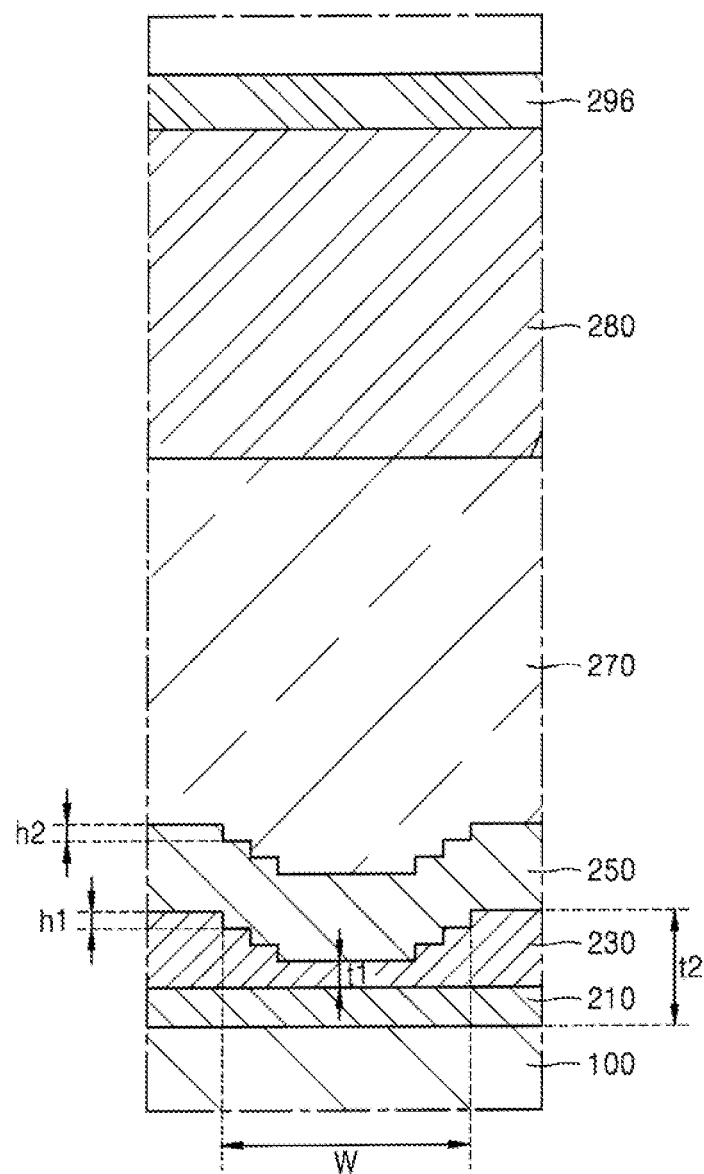
FIG. 5 is an enlarged cross-sectional view illustrating a portion V of FIG. 4 according to an exemplary embodiment of the present invention.

FIG. 4 is a schematic cross-sectional view illustrating a bending area BA of a flexible display apparatus according to an exemplary embodiment of the present invention. FIG. 5 is an enlarged cross-sectional view illustrating a portion V of FIG. 4 according to an exemplary embodiment of the present invention.

Referring to FIGS. 4 and 5, a flexible display apparatus 2 may include the flexible substrate 100, the first insulation layer 230, and the second insulation layer 250. The first insulation layer 230 may be arranged over the flexible substrate 100. The first insulation layer 230 may include the first unevenness 230a. The second insulation layer 250 may be arranged over the flexible substrate 100. The second insulation layer 250 may include the second unevenness 250a.

The flexible display apparatus 2 may differ from the flexible display apparatus 1 of FIG. 1 in shapes of the third insulation layer 270 and the fourth insulation layer 280 arranged over the first insulation layer 230 and the second insulation layer 250, respectively. In the flexible display apparatus 2 of FIG. 4, the third insulation layer 270 may fill grooves forming the first unevenness 230a and the second unevenness 250a of the first insulation layer 230 and the second insulation layer 250, respectively. Thus an upper surface of the flexible display apparatus 2 may be substantially planarized. The flexible display apparatus 2 of FIG. 4 may be substantially the same as the flexible display apparatus 1 of FIG. 1, and therefore redundant descriptions may be omitted.

According to an exemplary embodiment of the present invention, the first insulation layer 230 corresponding to a gate insulation layer may be disposed on the entire surface of the flexible substrate 100. At least a portion of the first insulation layer 230 arranged over the bending area BA of the flexible substrate 100 may include the first unevenness 230a. The first unevenness 230a may include at least two or more steps. Each step may have a height h1. As illustrated in FIG. 5, the first unevenness 230a may have a general "V" shape. The first unevenness 230a may have a stepped shape, which may be sunk toward the center.

The first unevenness 230a may include three steps. Each step may have the height h1. However, exemplary embodiments of the present invention are not limited thereto. The first unevenness 230a may include at least one step. The at least one step may have the height h1. The first unevenness 230a may be modified according to a thickness of the first insulation layer 230 and the height h1.

The first unevenness 230a may have the certain width W. For example, the width W of the first unevenness 230a may be less than about 1 mm. As illustrated in FIG. 4, the first unevenness 230a may be arranged between pixels. Thus the width W of the first unevenness 230a may be relatively smaller than spaces between adjacent pixels.

The second insulation layer 250 corresponding to an interlayer insulation layer may be arranged over the first insulation layer 230. The second insulation layer 250 may have the second unevenness 250a. The second unevenness 250a may be disposed on the first unevenness 230a of the first insulation layer 230. Similar to the first unevenness 230a, the second unevenness 250a may be arranged over the bending area BA of the flexible substrate 100.

The second unevenness 250a may include at least two or more steps. Each step may have a height h2. Similar to the first unevenness 230a, the second unevenness 250a may have a "V" shape. The second unevenness 250a may have a stepped shape, which may be sunk toward the center.

The second unevenness 250a may include three steps. Each step may have the height h2. However, exemplary embodiments of the present invention are not limited thereto. The second unevenness 250a may include at least one step. The at least one step may have the height h2. The second unevenness 250a may be modified according to a thickness of the second insulation layer 250 and the height h2. The first unevenness 230a and the second unevenness 250a may each be formed by using various methods known in the art and are not limited to a specific method. For example, the first unevenness 230a and the second unevenness 250a may be formed by etching using a photo resist, patterning using a halftone mask, or ultrafine printing using screen printing or inkjet printing.

The display unit 200 arranged over the flexible substrate 100 may include the plurality of pixels. The first unevenness 230a may be arranged between the plurality of pixels. The plurality of pixels may be sub-pixels. The plurality of pixels may be pixels formed by collecting sub-pixels.

In the flexible display apparatus 2, the flexible substrate 100 may have the bending axis A-A as illustrated in FIG. 1. The bending axis A-A may extend in one direction in the bending area BA. Thus, the first unevenness 230a and the second unevenness 250a may extend in a direction substantially parallel to the bending axis A-A. The first unevenness 230a and the second unevenness 250a may extend substantially parallel to the bending axis A-A. Thus, surface areas of the first insulation layer 230 and the second insulation layer 250 of the flexible display apparatus 2 may relatively increase in the bending area BA. Accordingly, cracks or separation of the first insulation layer 230 and the second insulation layer 250 may be reduced or prevented.

The first insulation layer 230 and the second insulation layer 250 may each be inorganic insulation layers. Portions of the inorganic insulation layers positioned over the bending area BA may include the first unevenness 230a and the second unevenness 250a. Since the first insulation layer 230 and the second insulation layer 250 may each be inorganic insulation layers, stress may concentrate and cracks may occur in the bending area BA.

The flexible display apparatus 2 may include the first unevenness 230a and the second unevenness 250a disposed in the first insulation layer 230 and the second insulation layer 250, respectively. The first insulation layer 230 and the second insulation layer 250 may each be inorganic insulation layers. The first insulation layer 230 and the second insulation layer 250 may be arranged over the bending area BA. When the flexible display apparatus 2 is bent in the bending area BA, the first unevenness 230a and the second unevenness 250a may increase the surface areas of the first insulation layer 230 and the second insulation layer 250. Thus, a stress applied to the first insulation layer 230 and the second insulation layer 250 may be reduced. Therefore, cracks or separation of the first insulation layer 230 and the second insulation layer 250 may be prevented.

Although a flexible display apparatus according to exemplary embodiments of the present invention has been described above, exemplary embodiments of the present invention are not limited thereto. For example, a method of manufacturing such a flexible display apparatus may also be within the scope of the disclosure.

It should be understood that exemplary embodiments of the present invention described herein should be considered in a descriptive sense only and not for purposes of limitation. Descriptions of features or aspects within each exemplary embodiment of the present invention should typically be considered as available for other similar features or aspects in other exemplary embodiments of the present invention.

While one or more exemplary embodiments of the present invention have been described with reference to the figures, it will be understood by those of ordinary skill in the art that various changes in form and details may be made therein without departing from the spirit and scope of the present invention as defined by the following claims.

What is claimed is:

1. A display apparatus, comprising:
   a substrate including a bending area;
   a first insulation layer disposed on the bending area of the substrate, the first insulation layer comprising a top surface having a first portion, a second portion, a third portion, and a fourth portion that are continuously connected to one another in a first direction,
   wherein, in an unbent state of the display apparatus, inclinations of the first and second portions are different from each other relative to the substrate and a distance between the first portion and the substrate is different from a distance between the third portion and the substrate, and
   wherein a thickness of the first portion of the first insulation layer and a thickness of the second portion of the first insulation layer are different from each other.

2. The display apparatus of claim 1, wherein the first portion, the second portion, the third portion, and the fourth portion are formed a stepped shape.

3. The display apparatus of claim 1, wherein a slope of the second portion is steeper than a slope of the first portion.

4. The display apparatus of claim 1, wherein the first insulation layer comprises an inorganic insulating material.

5. The display apparatus of claim 4, wherein the first insulation layer comprises a plurality of inorganic insulating layers.

6. The display apparatus of claim 1, wherein the bending area is bent along a bending axis, and the first direction is perpendicular to a second direction horizontal to the bending axis.

7. The display apparatus of claim 1, further comprising:
   a thin film transistor and a display element both disposed on the substrate, and
   wherein the thin film transistor includes a semiconductor layer, a gate electrode having at least a portion overlapping the semiconductor layer, and an electrode layer electrically connected to the semiconductor layer, and
   wherein the first insulation layer is arranged between the gate electrode and the electrode layer.

8. The display apparatus of claim 7, further comprising:
   a second insulation layer disposed on the bending area of the substrate, the second insulation layer comprising a fifth portion, a sixth portion, and a seventh portion that are continuously connected to one another, and
   wherein, in an unbent state of the display apparatus, inclinations of two adjacent portions of the fifth to seventh portions have different angles from each other, relative to the substrate.

9. The display apparatus of claim 8, wherein a slope of the fifth portion is different from the sixth portion.

10. The display apparatus of claim 8, wherein a distance between the fifth portion and the substrate is different from a distance between the seventh portion and the substrate.

11. The display apparatus of claim 8, wherein the second insulation layer is arranged between the semiconductor layer and the gate electrode layer.

12. The display apparatus of claim 1, wherein the top surface of the first insulating layer becomes closer to the substrate while proceeding to the first portion, the second portion, the third portion and the fourth portion.

13. The display apparatus of claim 1, wherein, in an unbent state of the display apparatus, the first portion and the third portion with the second portion interposed therebetween are substantially parallel to the substrate, and
   wherein a top surface of the first portion and a top surface of the third portion have different heights with respect to the substrate, and the second portion connects a step difference between the first portion and the third portion.

14. The display apparatus of claim 1, wherein the first to fourth portions have different inclinations of all two adjacent portions.

15. The display apparatus of claim 1, wherein the first insulating layer further includes an eighth portion, a ninth portion, a tenth portion, and an eleventh portion that are symmetrical to each other with the first to fourth portions based on an imaginary line parallel to the second direction.

16. The display apparatus of claim 15, wherein the eighth portion, the ninth portion, the tenth portion, and the eleventh portion are formed a stepped shape.

17. The display apparatus of claim 15, wherein a slope of the ninth portion is steeper than a slope of the eighth portion.

18. The display apparatus of claim 15, wherein the top surface of the first insulating layer becomes closer to the substrate while proceeding to the eighth portion, the ninth portion, the tenth portion and the eleventh portion.

19. The display apparatus of claim 15, wherein, in an unbent state of the display apparatus, the eighth portion and the tenth portion with the ninth portion interposed therebetween are substantially parallel to the substrate, and
   wherein a top surface of the eighth portion and a top surface of the tenth portion have different heights with respect to the substrate, and the ninth portion connects a step difference between the eighth portion and the tenth portion.

20. The display apparatus of claim 15, wherein the eighth to eleventh portions as different inclinations of all two adjacent portions.

21. The display apparatus of claim I, wherein a thickness of the third portion of the first insulation layer and a thickness of the fourth portion of the first insulation layer are different from each other.

22. The display apparatus of claim 1, wherein the thickness of the first portion of first insulation layer is different from a thickness of the third portion of the first insulation layer.

* * * * *